United States Patent
Wright

(10) Patent No.: US 11,742,819 B1
(45) Date of Patent: Aug. 29, 2023

(54) THREE-PORT SHUNTED INDUCTOR LATTICE COUPLER

(71) Applicant: Peter V. Wright, Cascais (PT)

(72) Inventor: Peter V. Wright, Cascais (PT)

(*) Notice: Subject to any disclaimer, the term of this patent is extended or adjusted under 35 U.S.C. 154(b) by 0 days.

(21) Appl. No.: 17/746,794

(22) Filed: May 17, 2022

(51) Int. Cl.
| | |
|---|---|
| *H03H 7/01* | (2006.01) |
| *H03H 7/09* | (2006.01) |
| *H03H 7/42* | (2006.01) |
| *H03F 3/189* | (2006.01) |
| *H03F 3/45* | (2006.01) |

(52) U.S. Cl.
CPC .......... *H03H 7/0115* (2013.01); *H03F 3/189* (2013.01); *H03F 3/45* (2013.01); *H03H 7/1741* (2013.01); *H03H 7/42* (2013.01)

(58) Field of Classification Search
CPC .......... H03H 7/0115; H03H 7/09; H03H 7/42
USPC .................................................. 333/177, 185
See application file for complete search history.

(56) References Cited

U.S. PATENT DOCUMENTS

| | | | | |
|---|---|---|---|---|
| 5,907,242 A | * | 5/1999 | Gard | E21B 47/0232 455/286 |
| 10,608,313 B2 | * | 3/2020 | Wang | H03H 7/38 |
| 2014/0002210 A1 | * | 1/2014 | Podell | H03H 7/46 333/175 |
| 2015/0065068 A1 | * | 3/2015 | Mattsson | H01F 27/2804 336/200 |
| 2019/0371518 A1 | * | 12/2019 | Viala | H01F 27/2804 |

OTHER PUBLICATIONS

"Balun Design," available Apr. 2016 from http://educypedia.karadimov.info/library/Balun%20Design.pdf, 6 pages.
"Baluns," available from http://web.ecs.baylor.edu/faculty/baylis/ee14421/baluns-f07.pdf, pp. 1-9 (Oct. 2007).
"Different Types of Baluns | applications of Balun types," RF Wireless World, pp. 1-7, available Dec. 2018 from https://www.rfwireless-world.com/Articles/Balun-basics-and-Balun-types.html.
Nataraj et al., "Analysis of Mutual Inductance and Coupling Factor of Inductively Coupled Coils for Wireless Electricity," ARPN Journal of Engineering and Applied Sciences, vol. 12, No. 13, pp. 4007-4012 (Jul. 2017).
Sengal et al., "Demystifying Transformers: Baluns and Ununs," Mini-Circuits Blog, pp. 1-12 (Jul. 2020).

* cited by examiner

*Primary Examiner* — Rakesh B Patel
(74) *Attorney, Agent, or Firm* — Klarquist Sparkman, LLP

(57) ABSTRACT

Apparatus and methods are provided for coupling RF signals. A lattice coupler design incorporating a pair of shunt inductors provides (i) a virtual ground for biasing and (ii) improved performance characteristics, in both splitter and combiner configurations. Magnetic coupling between the shunt inductors can be selected to maintain improved performance characteristics over a wide bandwidth, while retaining compactness and high efficiency. A design procedure, variations, and results are disclosed.

23 Claims, 6 Drawing Sheets

| SPLITTER SPECIFICATION | |
|---|---|
| FLO 1710 MHz | FHI 2025 MHz |
| PHASE SHIFT | ΔΦ = 180° |
| OUTPUT POWER RATIO | 0 dB |
| Z1 | 10 Ω |
| Z2 | 10 Ω |
| Z3 | 50 Ω |
FIG. 1
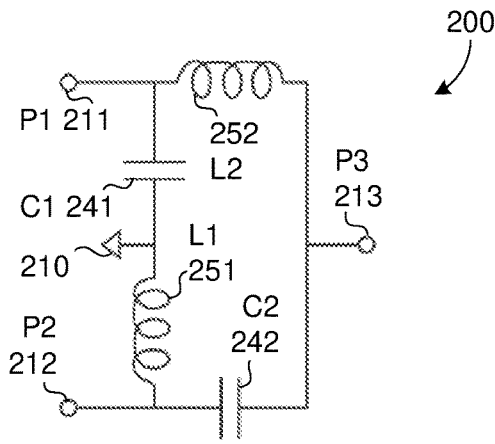
FIG. 2 (PRIOR ART)
| COMPONENT VALUES | |
|---|---|
| L2 = 2.695 nH | C1 = 2.695 pF |
| C2 = 2.695 pF | L1 = 2.695 nH |
FIG. 3 (PRIOR ART)
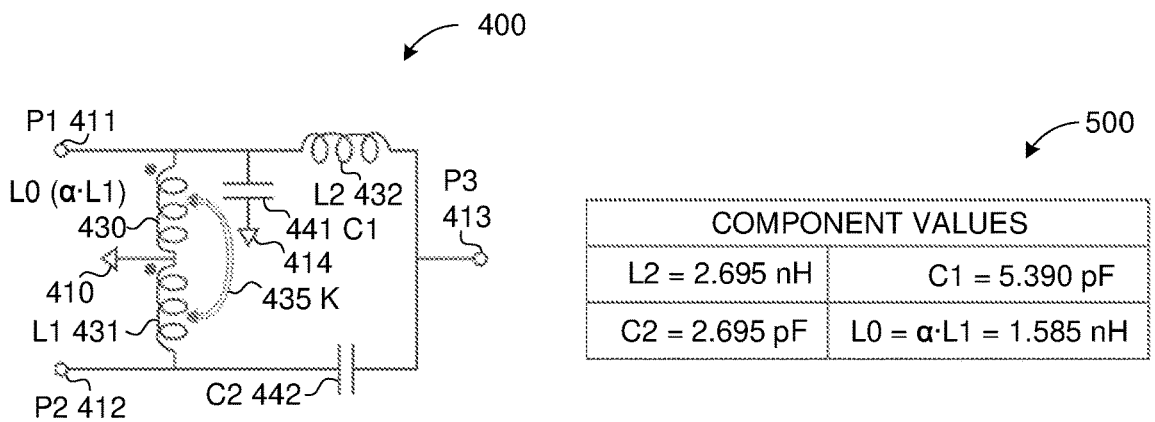
FIG. 4
| COMPONENT VALUES | |
|---|---|
| L2 = 2.695 nH | C1 = 5.390 pF |
| C2 = 2.695 pF | L0 = α·L1 = 1.585 nH |
FIG. 5

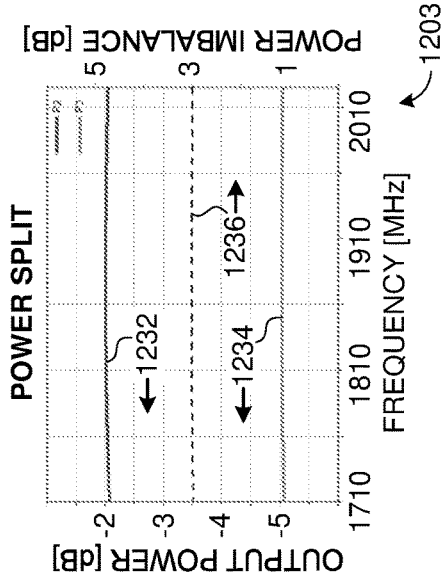
FIG. 12A
FIG. 12B
FIG. 12C
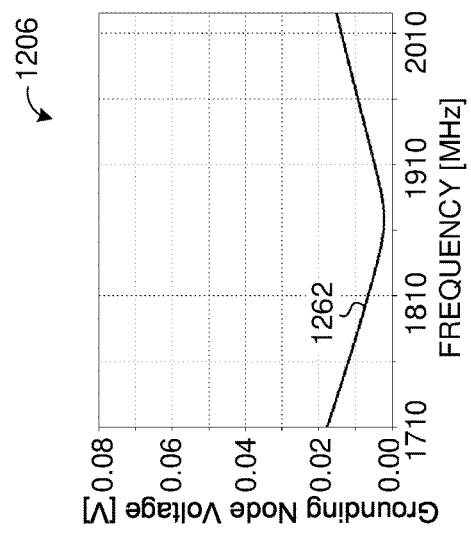
FIG. 12D
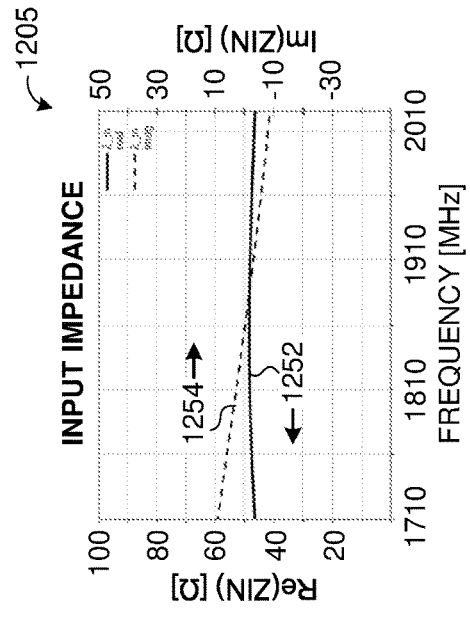
FIG. 12E
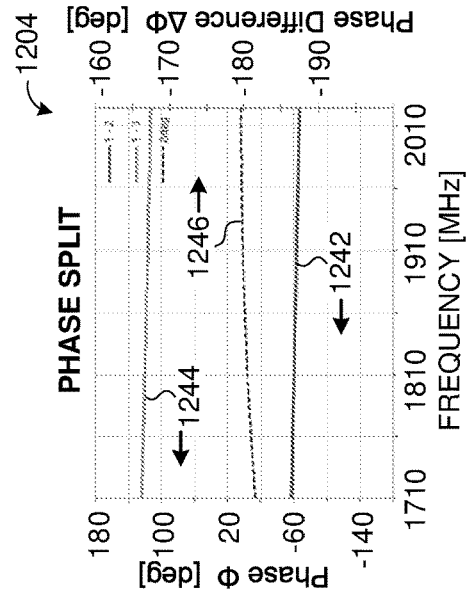
FIG. 12F

US 11,742,819 B1

THREE-PORT SHUNTED INDUCTOR LATTICE COUPLER

BACKGROUND

Reactive passive components such as inductors and capacitors are often used in ideally lossless splitting or combining networks for oscillatory or RF signals. In many applications, such networks may be required to operate over a finite bandwidth rather than at a spot frequency. Because inductor impedance and capacitor impedance vary differently with frequency, the network performance can also vary with frequency. For example, a design optimized at one frequency can have deteriorated performance at another frequency. Accordingly, there remains a need for improved technology for coupling networks for RF or other oscillatory signals.

SUMMARY

In brief, the disclosed technologies provide innovative coupler architectures offering notable improvements over conventional designs. The disclosed innovations can be applied for splitting or combining signals, e.g. at input or output stages of a differential power amplifier, and can support application of bias voltage through ports of the coupler.

In one aspect, the disclosed technologies can be implemented as a three-port coupler having three inductors and two capacitors. A first inductor is coupled between a first port and a first grounding node. A second inductor is coupled between a second port and a second grounding node. The first and second inductors have a predetermined mutual magnetic coupling factor. A third inductor is coupled between the first port and a third port. A first capacitor is coupled between the first port and a third grounding node. A second capacitor is coupled between the second port and the third port. The grounding nodes can variously be virtual grounds or tied to circuit ground, in any combination.

In a second aspect, the disclosed technologies can be implemented as a method. A first signal outputted from a first RF amplifier is received at a first port of a combiner. A second signal outputted by a second RF amplifier is received at a second port of the combiner. The first and second output signals are out-of-phase. The first signal is distributed from the first port along first, second, and third paths. The first path passes through a first inductive component to a first grounding node. The second path passes through a first capacitive component to a second grounding node. The third path passes through a second inductive component to a third port of the combiner. The second signal is distributed from the second port along fourth and fifth paths. The fourth path passes through a third inductive component to a third grounding node. The first and third inductive components typically have a mutual magnetic coupling factor of at least 0.2. The fifth path passes through a second capacitive component to the third port of the combiner. At the third port, responsive to receiving a portion of the first signal along the third path and receiving a portion of the second signal along the fifth path, a third signal is outputted from the combiner.

In another aspect, the disclosed technologies can be implemented as a system. The system includes a differential amplifier, an antenna, a bias power supply, a circuit ground, and a combiner. The combiner has three ports, a bias terminal connected to the bias power supply, three inductors, and three capacitors. First and second ports of the combiner are respectively coupled to receive out-of-phase outputs of the differential amplifier. The third combiner port is coupled to the antenna. A first inductor is coupled between the first port and the bias terminal. A second inductor is coupled between the second port and the bias terminal. The first and second inductors typically have a mutual magnetic coupling factor of at least 0.2. A third inductor is coupled between the first port and the third port. A first capacitor is coupled between the first port and the circuit ground. A second capacitor is coupled between the second port and the third port. A third capacitor is coupled between the bias terminal and the circuit ground.

The foregoing and other objects, features, and advantages of the disclosed innovations will become more apparent from the following detailed description, which proceeds with reference to the accompanying figures.

BRIEF DESCRIPTION OF THE DRAWINGS

FIG. 1 is a table of specifications for a splitter which can be implemented according to the disclosed technologies.

FIG. 2 is a circuit diagram of a prior art coupler.

FIG. 3 is a table of component values for the circuit diagram of FIG. 2 designed based on the specifications of FIG. 1.

FIG. 4 is a circuit diagram of a first example coupler according to the disclosed technologies.

FIG. 5 is a table of example component values for the circuit diagram of FIG. 4 designed based on the specifications of FIG. 1.

FIG. 12A is a table of specifications for an unbalanced splitter which can be implemented according to the disclosed technologies.

FIG. 12B is a table of example component values for the circuit diagram of FIG. 4 designed based on the specifications of FIG. 12A.

FIGS. 12C-12F are charts illustrating performance of the example coupler of FIG. 4 and FIG. 12B.

DETAILED DESCRIPTION

Introduction

Figure 6C:
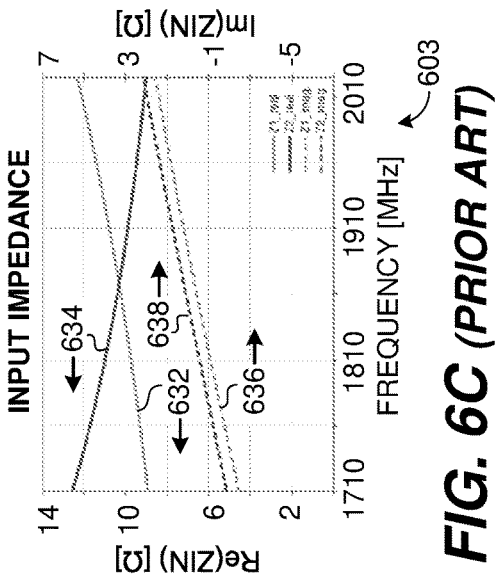
FIGS. 6A-6C are charts illustrating performance of the prior art coupler of FIGS. 2-3.

Couplers are widely used in electrical or electronic devices to combine two or more separate signals into one combined signal or to split one signal into two or more separate signals. The separate signals can be same or different. In some applications, the separate signals can be out-of-phase. As compactness and efficiency are often desirable, a differential amplifier architecture can be adopted. In a simple example, two amplifiers in parallel can amplify respective signals S1 and S2=−S1 to obtain g·S1 and g·S2=−g·S1, where g is the gain of each amplifier. A coupler can be operated as a splitter to generate S1, S2 from a source signal S0. Another coupler can be operated as a combiner to generate an output signal S3 from the amplifier outputs g·S1, g·S2. RF couplers are often built out of lossless components (e.g. reactive components such as inductors or capacitors, or segments of transmission lines such as waveguides) to obtain lower power dissipation compared to couplers based on resistors.

The differential amplifier architecture offers advantages of compactness and efficiency. Amplifiers commonly require DC power to amplify an oscillatory signal. Providing DC power to an RF circuit can pose a challenge of introducing DC power without providing leakage paths for RF signals. Leakage of RF can reduce amplifier gain or, worse, interfere with DC circuits providing the DC power. For a single-ended amplifier, an inductor can be used as a choke to pass DC current and block RF signals. However chokes can be large. In contrast, a differential amplifier affords a possibility of providing a balance point at which a linear combination of one signal from one amplifier and another signal from the other amplifier can cancel out. Such a point can have zero RF voltage and can be a virtual ground. In particular, a DC bias voltage can be applied at this virtual ground. Because the RF signals are canceled at the virtual ground, no large choke inductor is required, representing a significant space saving, which can more than compensate for extra circuit area required for two distinct amplifiers and couplers. This advantage can accrue even if the two amplifiers do not operate at the same amplitude, so long as a suitable linear combination is provided to obtain a virtual ground node.

In some examples, the two amplifiers can be operated with equal magnitude signals. Because these signals are out-of-phase, return RF currents in ground conductors can cancel. In a single-ended amplifier, parasitic resistance or reactance of practical ground conductors can dissipate power or reduce the available output RF signal as compared to ideal ground conductors. In contrast, by canceling RF ground currents, the differential amplifier architecture can reduce losses and can provide greater output RF power for a given amount of DC power, that is to say greater efficiency. Even for unbalanced amplifiers, partial cancellation of RF ground currents can provide an increase in efficiency, albeit not to the same extent as for a balanced differential amplifier.

However, conventional lossless couplers suffer from certain limitations. To illustrate, a conventional lattice coupler (similar to that described below in context of FIG. 2) does not intrinsically provide a grounding node for introducing a bias voltage. Transformer couplers can provide a grounding node at a center tap, but commonly require large size inductors for practical applications, which impacts both size and efficiency. This can be understood based on practically realizable inductive components having lower quality factor (about 60, at common cellular telephony frequencies) than capacitive components (about 100). Magnetic coupling, as commonly found in transformers, can suffer from higher insertion loss and narrower bandwidth than electrical coupling. Thus, a coupler design relying entirely on inductive components (including transformers) can be expected to have higher losses than a coupler design relying on both capacitive and inductive reactive components.

Still further, reactive couplers can readily be designed for spot frequencies. However, it can be desirable to operate a communication terminal at multiple frequencies, for compatibility with a variety of frequency bands and network standards. Other applications can employ instantaneous wideband operation or frequency hopping. While reactive impedances can be selected for proper phase difference, power split, and impedance matching at a spot frequency, inductive and reactive components vary differently as frequency changes. As operating frequency deviates from the properly behaved spot frequency, multiple performance characteristics can deteriorate, limiting the useful operating frequency range of a coupler in a differential amplifier system.

Examples of the disclosed technologies avoid the drawbacks of conventional designs noted above. First, a pair of inductors can provide one (or even two) grounding nodes for introduction of bias power. Second, component values permit compact realization. Third, low insertion loss can be achieved, providing good efficiency. Fourth, magnetic coupling between the inductors forming the grounding node can be selected as a design parameter, and can be used to further improve performance characteristics.

These and other advantages are brought out through examples described herein.

Terminology

An "amplifier" is a device or circuit for increasing the amplitude or power of an oscillatory signal. Amplitude or power can be quantified in Volts, Amperes, Watts, dB, dBm, or any similar units. An amplifier is commonly fabricated using one or more transistors in various configurations. Nonlimiting examples of transistor amplifier configurations include common emitter, common base, or push-pull. Amplifiers can be grouped, for example in parallel branches or in series stages. To illustrate, a preamplifier can be followed by another amplifier stage. A "power amplifier" is an amplifier not followed by another amplifier stage. While some power amplifiers can be preceded by another amplifier stage, this is not a requirement and a single amplifier can be a power amplifier. In examples, a power amplifier can be coupled to an antenna or to another load. A "differential power amplifier" (or simply "differential amplifier") is a parallel combination of two amplifiers configured to accept differential input signals and generate differential output signals. Thus, a combination of the output signals is an amplified version of the input signals.

An "antenna" is a device that couples electromagnetic radiation in a medium to or from electrical or electromagnetic signals in a circuit.

A "bias power supply" is an apparatus capable of providing DC energy to an electrical circuit. Non-limiting examples of bias power supplies include: a battery, an electronic voltage regulator, or a solar cell.

A "capacitor" is a two-terminal circuit component that, with voltage applied across the terminals, stores charge on the terminals and stores electric field energy between the terminals. A capacitor can be characterized by its "capacitance" which is the ratio of charge on either terminal to voltage across the terminals. Capacitors are commonly used as reactive elements in circuits, and can provide a frequency-dependent negative reactance. Some capacitors described herein can be implemented with specific capacitance values to impart, in combination with other circuit components, desirable properties to a circuit. Other capacitors can be implemented to provide low reactance values between the terminals, without providing a DC path. Such capacitors can be referred to as "bypass" or "DC blocking" capacitors, and can commonly be chosen with widely varying capacitance values without significantly compromising circuit performance. Common capacitors can have a quality factor ("Q") up to about 100, and can be modeled as lossless devices or, for greater accuracy, with accompanying parasitic resistances or inductances. Capacitors can be implemented as discrete or distributed components including, in some examples, a portion of a transmission line. A "capacitive component" is an electrical component exhibiting negative reactance, which can variously include one or more capacitors, pieces of waveguide, or other distributed capacitors, and can optionally include wiring and other components.

A "carrier frequency" is a frequency of a signal which can be modulated to carry information. A carrier frequency does not require that the carrier be present in the modulated signal, as illustrated by suppressed carrier signaling techniques.

A "communication terminal" is an apparatus capable of receiving or transmitting information-bearing electromagnetic signals over a medium (which can include vacuum). A "cell phone" is a portable communication terminal for a cellular telephone network. Non-limiting examples of communication terminals include cell phones; base stations; access points; television sets; set top boxes; radios; network interface cards; cable or fiber head ends; satellites and associated ground terminals; or other transmitters or receivers for wireless, wired, or optical communication networks.

A "coupler" is a circuit device having N+1 ports for an integer N>2, which can also be dubbed an "N-to-1 coupler". A coupler couples a signal at one port to N signals at the other N ports. In some instances, the signal at the one port is an input, and the other N signals are outputs. Such a configuration is dubbed a "splitter". In other instances, the signal at the one port is an output, and the other N signals are inputs. Such a configuration is dubbed a "combiner". A given coupler can be variously operated as a splitter or a combiner according to the environment in which it is used and what signal(s) are applied to its port(s). Although less common, a given coupler can function as both a splitter and a combiner at same or different times, or at same or different frequencies. Some couplers disclosed herein are three-port devices (N=2), but this is not a requirement. Other examples are disclosed having cascaded three-port couplers forming five-port (four-to-one) or nine-port (eight-to-one) couplers.

"DC" refers to any electrical signal that performs its function without requiring an oscillatory component. For example, a bias power supply can provide a DC bias voltage to a circuit. The label DC does not preclude temporal variation. To illustrate a DC signal can be switched on or off, can droop over time, or can exhibit imperfect load regulation or line regulation. In some examples, the DC signal amplitude may be varied at a rate close to the amplitude modulation of the carrier frequency. This so-called "envelope modulation frequency" can be much lower than the carrier frequency, often less than 10% or less than 1% of the carrier frequency. Additionally, due to non-ideal characteristics of circuit components, DC signals can be superposed with oscillatory leakage or ripple. The term DC can also describe components associated with DC signals. To illustrate, a DC blocking capacitor can present a high impedance to a DC signal.

The term "direct" refers to a coupling of two electrical nodes or devices in such a way as to allow DC current to flow, commonly by a segment of a conductive material such as a wire. Directly coupled nodes or devices are said to be "tied" together.

The term "distribute" refers to dividing a received signal into multiple parts directed to respective paths of a circuit. Each of the parts carries a portion of the power in the received signal.

"Ground" refers to one or more nodes or conductive portions of a circuit at a constant electrical potential. "Circuit ground" refers to a ground that is at a DC reference voltage for the circuit (dubbed "ground voltage" and sometimes assigned a DC voltage of 0 V). "Virtual ground" refers to a ground that can be at a fixed or variable DC voltage other than the ground voltage, but which cannot support oscillatory (e.g. RF) signals close to the carrier frequency. For oscillatory signals within the operating bandwidth of the circuit, the impedance between a virtual ground and circuit ground can be less than 20% of the characteristic impedance of signal circuits coupled to the virtual ground. A "grounding node" refers to a node of a circuit device configured to be a circuit ground (e.g. tied to the ground voltage) or a virtual ground (e.g. coupled to circuit ground through a bypass capacitor).

"Impedance" is a property of a circuit or component that is a ratio of voltage (applied to the circuit or component) to current (that flows in the circuit or component). Impedance can be complex: the real and imaginary part are dubbed "resistance" and "reactance" respectively. The reciprocal of impedance is dubbed "admittance", which has real and imaginary parts dubbed "conductance" and "susceptance" respectively. A "characteristic impedance" of a circuit or component is an impedance value which, if coupled to a port of the circuit or component, minimizes reflections at that port. A circuit or component can have different characteristic impedances on different ports.

An "inductor" is a two-terminal circuit component that, with current applied through the component, encircles magnetic flux and stores magnetic energy in a volume enclosed by or proximate to the component. An inductor can be characterized by its "inductance" which is the ratio of encircled magnetic flux to current passing through the terminals. Inductors are commonly used as reactive elements in circuits, and can provide a frequency-dependent positive reactance. Some inductors described herein can be implemented with specific inductance values to impart, in combination with other circuit components, desirable properties to a circuit. Other inductors can be implemented to provide high reactance values between the terminals, while also providing a low resistance DC path. Such inductors can be referred to as "RF blocking" or "choke" inductors, and can commonly be chosen with widely varying inductance values without significantly compromising circuit performance. Common inductors can have a quality factor ("Q") up to about 60, and can be modeled as lossless devices or, for greater accuracy, with accompanying parasitic resistances or capacitances. Inductors can be implemented as discrete or distributed components including, in some examples, a portion of a transmission line. An "inductive component" is an electrical component exhibiting positive reactance, which can variously include one or more inductors, pieces of waveguide, or other distributed inductors, and can optionally include wiring and other components.

"The mutual inductance" between two coils with inductances L1 and L2 is denoted by "M12". It is a measure of the degree of magnetic coupling between the two coils. It defines how much voltage is generated across the second coupled inductor by current flowing in the first coupled inductor. The mutual inductance is defined in terms of a "mutual magnetic coupling factor" (sometimes "magnetic coupling factor" or "inductive coupling coefficient", and denoted by "K") by $M12=K\sqrt{L1 \cdot L2}$. The coupling coefficient K has a value between 0, i.e. zero, which is indicative of no inductive coupling, and 1 which indicates full or maximum inductive coupling.

In some proposed SILC configurations, the magnetic coupling between the two coupled inductors can improve the overall performance of the coupler. The impedance characteristics on the coupler ports, together with its amplitude and phase characteristics, can all be significantly enhanced by the magnetic coupling. In some configurations, the higher the value of the magnetic coupling that can be achieved, the more improved are the characteristics of the SILC implementation.

A "node" or "terminal" is an attachment point of an electrical component. In some instances, a node can be a junction between two or more components in an electrical circuit. The components can be discrete components (such as some inductors or capacitors), distributed components (such as waveguide components), or simply sections of conductive wiring, in any combination. A node of an electrical device (such as a coupler) can be coupled to an external component such as wiring, a ground plane, or another electrical component.

Two periodic signals at a common frequency are "out-of-phase" if a phase difference between them is in a range [120°, 240°]. Two out-of-phase signals are "opposite phase" if the phase difference between them is in a range [170°, 190°]. Two oppositely phased signals are "differential" if they exhibit the same modulation or carry the same information. Two out-of-phase signals are "balanced" if they have power levels within 1 dB of each other, and "unbalanced" otherwise. Statements herein referring to any one of these classes are understood to be equally applicable to any subset of that class. To illustrate, a statement about out-of-phase signals implies the same for differential signals or unbalanced signals.

A "pattern" is a geometric layout of one or more circuit components, which can be one-dimensional (e.g. a length of wire), two-dimensional (e.g. an inductor fabricated as a planar spiral structure), or three-dimensional (e.g. a waveguide or capacitor formed between two parallel conductive components on one or two layers).

"RF" stands for radio frequency, covering a range from about 300 kHz to about 300 GHz (the RF frequency range), and can refer to electromagnetic signals or processes in that frequency range, or to circuit devices operating in that frequency range.

A "spiral" is a pattern formed of two or more loops having a common center. A three-dimensional spiral formed on a cylindrical surface can have a common center which is an axis of the cylinder. A two-dimensional spiral formed in a conductive layer of a circuit can have a common center which is a point. In varying embodiments, the loops of a spiral pattern can be circular, oval, semicircular, square, rectangular, or another shape.

"Performance characteristics" of a circuit device are quantifiable parameters that indicate a relationship between output and/or input signals of the device. Performance characteristics may be dependent on a circuit environment in which the circuit device is placed. To illustrate, output signal characteristics of a device can vary according to whether the device is coupled to a matched load or a mismatched load; or can vary according to the bias voltage applied to the device. Non-limiting examples of performance characteristics relevant to disclosed examples include: "input impedance" which can refer to the ratio of voltage applied at a port to the current flowing into that port, and which can apply to both input ports or output ports of a device; "insertion gain" which can be a ratio of output power to input power, and which can apply to coupler or splitter configurations of disclosed couplers; "phase difference" (or "phase split") which can be a difference in phase between two outputs of a splitter; or "power split" which can be a distribution or a difference in power between two outputs of a splitter. "Bandwidth" can be a design requirement of a frequency range over which a circuit device is required to operate, optionally with a particular value (or, range of values) of a performance characteristic. A coupler can also have a "coupling imbalance". A splitter can have respective transfer functions H1, H2 from input port P3 to output ports P1, P2. A combiner can have respective transfer functions H1, H2 from input ports P1, P2 to common output port P3. In either configuration, H1/H2, |H1/H2|, or log |H1/H2| can be measures of the difference in coupling of common port P3 to the two ports P1, P2, dubbed the coupling imbalance. The coupling imbalance can be related to phase difference (e.g. arg (H1/H2)) or power split (e.g. log |H1/H2|).

A "port" is an attachment point of an electrical device at which a time-varying signal can be inputted or outputted. Thus, ports can exclude ground connections. For example, a four-port device can be transformed into a three-port device by tying one of the four ports to circuit ground. The presence of a time-varying signal does not preclude a port from also receiving or delivering a DC signal. Some couplers described herein are advantageously able to supply a bias voltage to one or more connected devices through a same port at which a time-varying signal is inputted or outputted.

The term "signal" refers to any propagating electromagnetic energy in the form of current, voltage, electric field, or magnetic field, in any combination. Signals can flow along wires, along waveguides, through electrically conductive, dielectric, or electrically insulating media, or through a vacuum. Some signals of interest herein can carry information or can exhibit oscillatory behavior, however neither of these are requirements. Signals can be acted on by a wide range of devices, including amplifiers and couplers (including both combiner and splitter configurations). Commonly, such devices receive signals dubbed "input signals" (or simply "inputs") and generate signals dubbed "output signals" (or simply "outputs"). A signal can have a magnitude, which can be denominated in Volts, Amperes, Watts, dB, dBm, or any similar units. An oscillatory signal at a given frequency can also have a "phase", which indicates a temporal offset (commonly measured in units of angle) relative to a reference at the given frequency. Inasmuch as relative phases and changes in phase are often of interest, the reference can be virtual, e.g. no reference signal need be present.

A "substrate" is a generally planar medium upon which circuit elements can be formed (e.g. by photolithographic, chemical etch, or deposition processes) or mounted (e.g. by soldering). Non-limiting examples of substrate materials include FR-4, DUROID®, silicon, silicon dioxide, silicon carbide, or alumina. In examples, alternating electrically conductive and electrically insulators "layers" can be formed on a substrate, with electrical devices defined by patterns in the conductive layers and, optionally, doping or etch in the insulating layers, with conductive paths ("vias") formed between conductive layers as needed.

"Tolerance" refers to a variation of an electrical parameter or performance characteristic about an ideal or design value of that parameter or characteristic.

Tolerances can be specified in absolute or relative units. Where no tolerance is specified, two like signals or associated measures can be considered equal if they are within about 25% or 1 dB in power, or 12% in a linear scale (e.g. volts). Other parameters (e.g. impedances, DC voltages, or currents) can be considered equal if they are within about 12%.

Balanced Splitter FIG. 1 is a table 100 of specifications for a splitter which can be implemented according to the disclosed technologies. The splitter has an operating band extending from a low frequency FLO=1710 MHz to a high frequency FHI=2025 MHz. A design goal is for two split output signals to be out-of-phase, with a relative phase shift of 180°, and balanced, with an output power ratio of 0 dB. The splitter output ports are intended to present impedance of Z1=Z2=10Ω to respective loads, while the splitter input port is intended to match a source (or transmission line) having a source impedance of 50Ω. As discussed herein, these specifications are goals. The goal for a given parameter is sometimes termed its "design" value. Different splitters can be designed according to these specifications, and may meet or deviate from the specifications (design values) to varying extents across the operating frequency band.

Conventional Coupler (Splitter)

FIG. 2 is a circuit diagram of prior art coupler 200. The illustrated circuit 200 is in a general class of couplers sometimes termed "lattice couplers". Components of this circuit 200 can be determined based on frequency of operation, port impedances, power ratio between ports P1 211, P2 212 and, to some extent phase shift between ports P1 211, P2 212.

Circuit 200 can be operated as a splitter or as a combiner. Operated as a splitter, a source signal at a design frequency can be input at port P3 213, to deliver corresponding output signals at ports P1 211, P2 212. Operated as a combiner, input signals (having a power ratio and phase shift approximately equal to the design values of these parameters) can be input at ports P1 211, P2 212, and a combined signal can be outputted at port P3 213.

From a splitter perspective, the source signal inputted at port P3 213 can be divided between an upper branch leading to port P1 211 and a lower branch leading to port P2 212. In the upper branch, the series combination of inductor L2 252 and capacitor C1 241 can result in the output signal voltage at port P1 211 lagging the source signal voltage while, in the lower branch, the series combination of capacitor C2 242 and inductor L1 251 can result in the output signal voltage at port P2 212 leading the source signal voltage.

Node 210 can be a grounding node. Coupler 200 has a DC path from grounding node 210 to port P2 212 through inductor L1 251, however there is no such path from grounding node 210 to port P1 211. Accordingly, node 210 has limited utility for providing bias voltage to downstream devices. Commonly, node 210 is tied directly to circuit ground.

FIG. 3 is a table of component values for the circuit diagram of FIG. 2 designed based on the specifications of FIG. 1, with mutual magnetic coupling factor between L0 and L1 set to K=0.7. The performance of this circuit is described further below in the context of FIG. 6.

First Example Coupler (Splitter)

FIG. 4 is a circuit diagram of innovative example coupler 400. The components of coupler 400 are laid out in similar fashion as FIG. 2 to highlight their differences. Notably, shunt inductor L0 430 has been introduced between port P1 411 and grounding node 410. Accordingly, coupler 400 can be termed a "shunted inductor lattice coupler" (or "SILC"). Shunt inductors L0 430, L1 431 can have a mutual magnetic coupling factor K 435.

Coupler 400 has three ports P1-P3 411-413. Like coupler 200, coupler 4 can be operated as a splitter, with input at port P3 413 and outputs at ports P1-P2 411-412, or as a combiner, with inputs at ports P1-P2 411-412 and output at port P3 413. The person of ordinary skill will appreciate that, through the principles of reciprocity or time-reversal symmetry, the operating characteristics of coupler 400 are similar in the splitter and combiner modes of operation, for a given set of component values.

FIG. 5 is a table of example component values for the circuit diagram of FIG. 4 designed based on the specifications of FIG. 1. Calculation of these component values is described below, with reference to Equations (1)-(10). The performance of this circuit is described also below, in the context of FIG. 7.

The illustrated configuration of coupler 400 includes three inductors and two capacitors. Inductor L0 430 is coupled between port P1 411 and grounding node 410, and inductor L1 431 is coupled between port P2 and grounding node 410. While FIG. 4 shows both inductors L0 430, L1 431 coupled to a same grounding node 410, this is not a requirement and, in variations, inductors L0 430, L1 431 can be coupled to distinct grounding nodes. Additionally, inductors L0 430, L1 431 can have a mutual magnetic coupling factor k. Common configurations can have k>0.2, and sometimes k>0.6 or k>0.75. However, this is not a requirement, and other configurations can provide beneficial performance even with k<0.2, k<0.1, or k=0 to within a tolerance.

The remaining inductor L2 432 is coupled between port P1 411 and port P3 413. Capacitor C1 441 is coupled from port 411 to grounding node 414, and capacitor C2 442 is coupled from port P2 412 to port P3 413.

Numerous variations and extensions can be implemented within scope of the disclosed technologies.

In some examples, coupler 400 can be configured to receive an input signal at port P3 413 and generate out-of-phase split signals at ports P1 411, P2 412 respectively. In assorted examples, the phase difference between the split signals can vary by less than 2°, 5°, or 10° over a 5%, 10%, or 20% bandwidth, in any combination. In other examples, coupler 400 can be configured to receive out-of-phase first and second input signals at the ports P1 411, P2 412 respectively, and to generate a combined output signal at port P3 413. In assorted examples, the input impedance at each of ports P1 411, P2 412 can vary by less than 5%, 15%, or 30% over a 5%, 10%, or 20% bandwidth, in any combination. In either splitter or combiner mode of operation, the ports P1 411, P2 412 can exhibit a coupling imbalance. To illustrate, as a splitter, coupler can provide different amounts of power to matched loads at ports P1 411, P2 412. In assorted examples, the coupling imbalance can vary by less than 0.2 dB, 0.5 dB, or 1.0 dB over a 5%, 10%, or 20% bandwidth, in any combination.

Any of inductors L0, L1, L2 430-432 can be implemented as a printed inductor, e.g. as a spiral pattern formed on a substrate by photolithography, or as a discrete component, e.g. as a cylindrical or toroidal wire winding. Printed inductors can be formed in separate layers on the substrate, and any required degree of magnetic coupling can be obtained through an area overlap between two inductors. To illustrate, area overlaps of 20%-60%, 60%-75%, or at least 75% can be used to obtain progressively greater values of magnetic coupling. Magnetically coupled planar inductors can also be formed in a common layer, with concentric patterns, or adjacent to one another. Magnetic coupling can also be achieved through the use of a common core formed of ferrite or another solid material.

In some applications, coupler 400 can be used in a balanced configuration, and the ratio α=L0/L1 can be set to 1. That is, with equal inductance values for L0 430, L1 431 and equal signal amplitudes at ports P1 411, P2 412, oscillatory currents at node 410 can cancel each other, resulting in a virtual ground. In other examples, coupler can be used in an unbalanced configuration, and α can be set based on the power imbalance and on the value of magnetic coupling K 435. For the case K=0, it can be seen that α=V1/V2 provides cancellation of oscillatory currents at node 410, where V1, V2 are voltage and power levels at ports P1 411, P2 412 respectively, and this value of α can be used. However, the value of K 435 can affect the circuit behavior and the suitable design value of a, as described further herein.

Because grounding node 410 has DC paths to both ports P1 411, P2 412, it can be configured as a virtual ground and used to apply a bias voltage to devices coupled to ports P1 411, P2 412. That is, grounding node 410 can be directly coupled to a bias power supply, and also coupled to circuit ground through a bypass capacitor (not shown). With one or more such bypass capacitors, coupler 400 can provide a DC block between circuit ground and each port P1 411, P2 412. With inductors L0 430, L1 431 tied to common grounding node 410, as illustrated in FIG. 4, a single bypass capacitor can be used at node 410. In other examples, inductors L0 430, L1 431 can have distinct grounding nodes and distinct bypass capacitors. The latter configuration can also provide a DC block between ports P1 411, P2 412, advantageously enabling distinct bias voltages to be supplied through ports P1 411, P2 412. In further examples, no bias voltage is necessary, and both inductors L0 430, L1 431 can be tied to circuit ground, separately or at a common point. Node 414 can also be tied to circuit ground.

Coupler 400 can be integrated into an amplifier assembly such as a power amplifier. Two out-of-phase signal outputs of a differential amplifier can be coupled to ports P1 411, P2 412 of coupler 400, to obtain a combined output at port P3 400. The combined output can be coupled to an antenna. The differential amplifier, coupler 400, and antenna can be integrated into a communication terminal, such as a cell phone. Alternatively or additionally, a signal source can be coupled to another instance of coupler 400, to obtain two out-of-phase split outputs which can be coupled to respective inputs of the differential amplifier.

Multiple instances of coupler 400 can be cascaded together. To illustrate, three couplers 400 can be coupled together to obtain a four-to-one coupler, or seven couplers can be coupled together to obtain an eight-to-one coupler. From the perspective of a combiner, two instances of coupler 400 can receive four signals at their collective input ports P1(2), P2(2), to generate two intermediate signals at their P3 ports. The intermediate signals can be further combined in a third instance of coupler 400 to obtain a four-way signal combination. The configuration for higher orders or for cascaded splitters is similar.

Splitter Performance Comparison

Figure 6B:
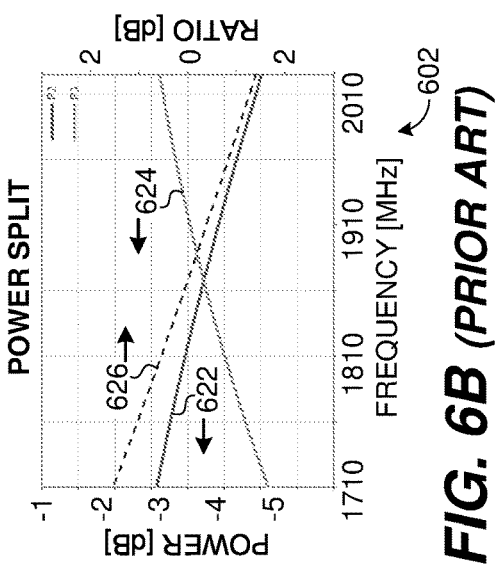
Figure 6A:
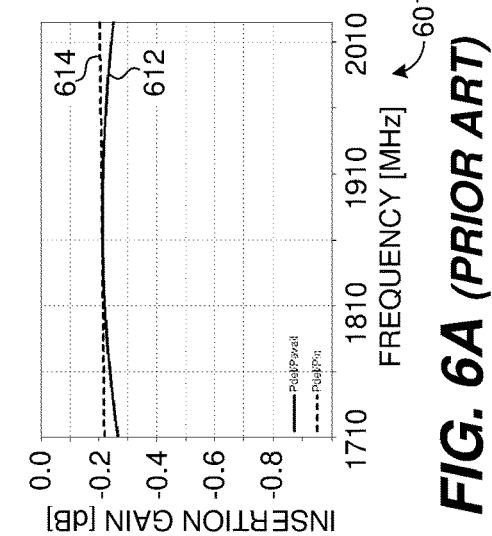
Figure 7C:
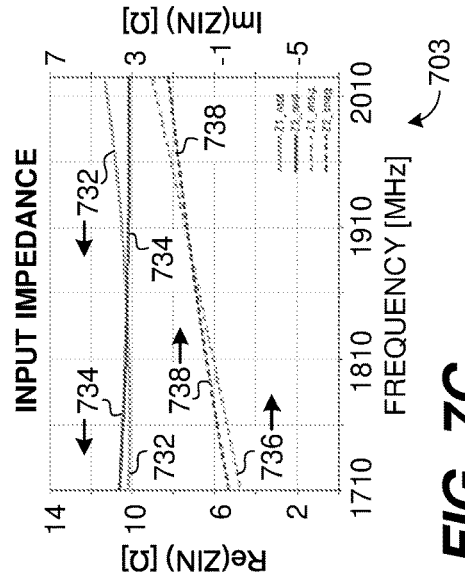
FIGS. 7A-7C are charts illustrating performance of the example coupler of FIGS. 4-5.
Figure 7B:
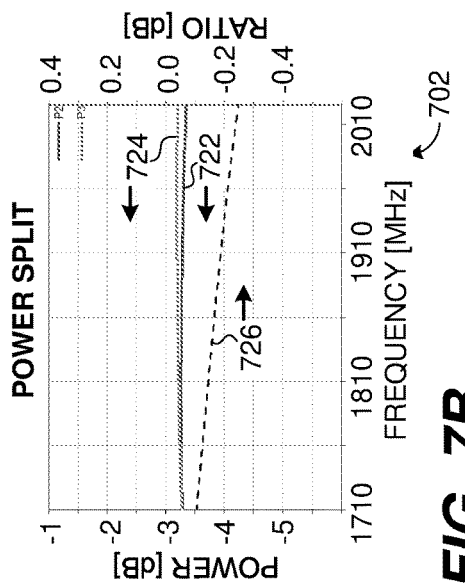
Figure 7A:
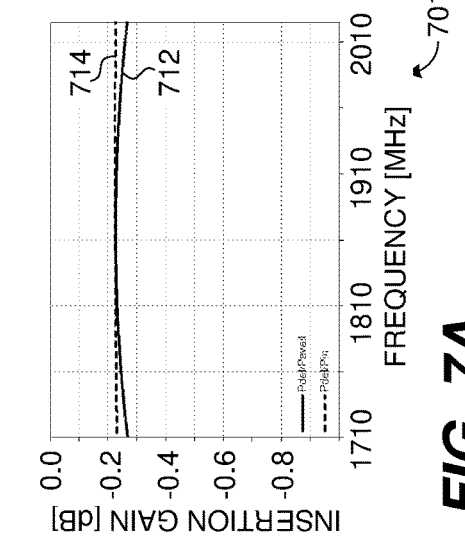

FIGS. 6A-6C are charts illustrating performance of prior art coupler 200 of FIGS. 2-3, while FIGS. 7A-7C are charts illustrating performance of the innovative coupler 400 of FIGS. 4-5. Both couplers 200, 400 are characterized over the full operating band 1710-2025 MHz as specified in FIG. 1.

Beginning with FIG. 6A and FIG. 7A, the insertion gain performance is generally similar for couplers 200, 400. Dashed line graphs 614, 714 show the ratio of delivered power at output ports P1, P2 to the power inputted at port P3 of the respective couplers 200, 400. The small losses of about 0.2 dB can be due to resistive losses in non-ideal components. The illustrated performance is obtained with inductors having a quality factor Q=60 and capacitors having Q=100. Solid line graphs 612, 712 show the ratio of delivered power at output ports P1, P2 to the maximum available power from a source coupled to port P3 of the respective couplers 200, 400. Graphs 612, 712 exhibit droop toward both ends of the operating frequency band, which can be due to impedance mismatches at all ports P1, P2, P3 as the operating frequency diverges from a center frequency of the operating band.

Turning to FIG. 6B and FIG. 7B, innovative coupler 400 shows markedly superior power split across the operating band. Graphs 622, 722 show output power at port P1 of respective couplers 200, 400, while graphs 624, 724 show output power at port P2 of respective couplers 200, 400. Graphs 626, 726 show the ratio (power at P1)/(power at P2) for respective couplers 200, 400. Coupler 200 is seen to have power split varying by about 3 dB across the operating band, while the power split of coupler 400 varies by about 0.15 dB. That is, coupler 400 demonstrates a 20× improvement in power split variation compared to the conventional design.

Continuing with FIG. 6C and FIG. 7C, innovative coupler 400 also shows significantly better impedance matching across the operating band. Graphs 632, 634, 636, 638 respectively show the real part of impedance Re(ZIN) at port P1, Re(ZIN) at port P2, imaginary part of impedance Im(ZIN) at port P1, and Im(ZIN) at port P2 for coupler 200. Graphs 732, 734, 736, 738 show the corresponding quantities for coupler 400. As indicated in FIG. 1, the design specification for both ports P1, P2 is ZIN=10Ω, which can be resolved into real and imaginary parts as Re(ZIN)=10Ω and Im(ZIN)=0Ω. While the smaller Im(ZIN) varies comparably for couplers 200, 400, the variation in the dominant Re(ZIN) is seen to have greater than 3Ω variation for coupler 200, and about 1.5Ω variation for innovative coupler 400. That is, innovative coupler 400 demonstrates a 2× improvement in impedance variation compared to the conventional design.

Additional Example Couplers

Figure 8:
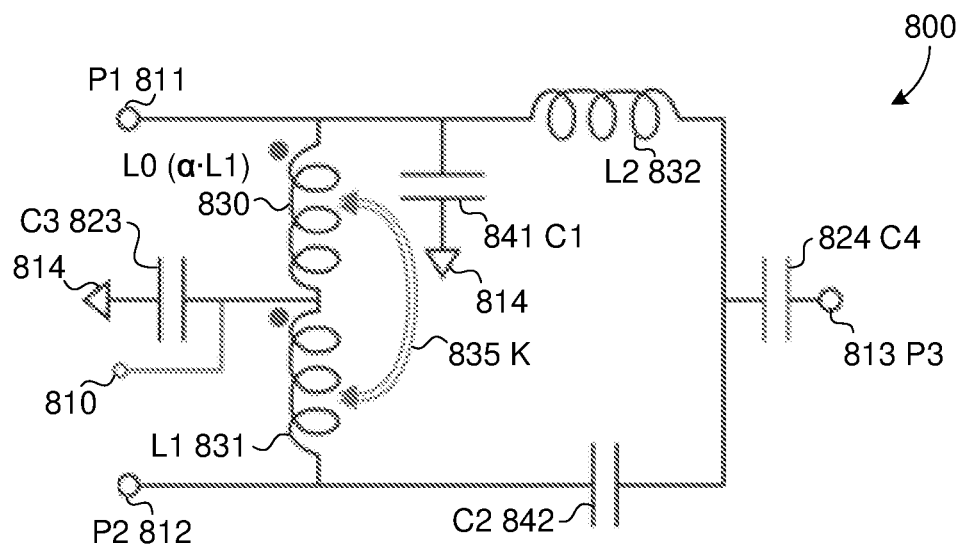
FIG. 8 is a circuit diagram of a second example coupler according to the disclosed technologies.
Figure 9:
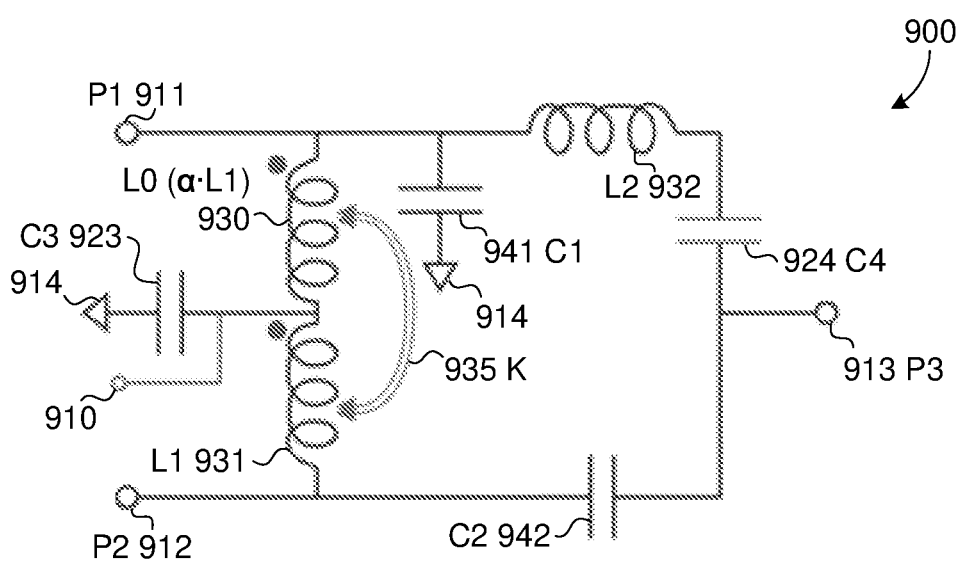
FIG. 9 is a circuit diagram of a third example coupler according to the disclosed technologies.

FIGS. 8-9 are circuit diagrams of additional innovative example couplers 800, 900. These couplers are illustrated with provision for providing bias voltage at ports P1, P2 and providing DC block between the bias voltage terminal and port P3.

Starting with coupler 800, ports P1 811, P2 812, P3 813 correspond to ports P1-P3 of coupler 400 described above. Additionally, inductors L0 830, L1 831, L2 832 and capacitors C1 841, C2 842 are arranged similarly to corresponding L0, L1, L2, C1, C2 of coupler 400 and are not described further. As for coupler 400, a provision for magnetic coupling K 835 is depicted between inductors L0 830 and L1 831.

In contrast to FIG. 4, grounding node 810 is explicitly shown as a virtual ground which is bypassed to circuit ground 814 by bypass capacitor C3 823. A bias power supply can be directly coupled to node 810 to provide a bias voltage at ports P1 811, P2 812. With coupler 800 operated as a splitter, the bias voltage from node 810 can be provided to input stages of downstream amplifiers coupled to ports P1 811, P2 812. With coupler 800 operated as a combiner, the bias voltage from node 810 can be provided to output stages of upstream amplifiers coupled to ports P1 811, P2 812.

Additionally, a blocking capacitor C4 824 can be provided at port P3 to provide DC isolation between the bias power supply and a device coupled to port P3.

Turning to FIG. 9, coupler 900 is generally similar to coupler 800. Ports P1 911, P2 912, P3 913 correspond to ports P1-P3 of couplers 400, 800 described above. Similarly, inductors L0 930, L1 931, L2 932 and capacitors C1 941, C2 942 are arranged similarly to corresponding L0, L1, L2, C1, C2 of couplers 400, 800 and are not described further. As for couplers 400, 800 a provision for magnetic coupling K 935 is depicted between inductors L0 930 and L1 931. Also like coupler 800, node 910 is shown as a virtual ground which is bypassed to circuit ground 914 by bypass capacitor C3 923. A bias power supply can be directly coupled to node 910 to provide a bias voltage at ports P1 911, P2 912.

In contrast to coupler 800, DC blocking between virtual ground 910 and output port P3 913 can be provided by placing capacitor C4 924 in series with inductor L2 932. This is possible because the other circuit arm between ports P2 912 and P3 913 already has capacitor C2 942 serving as a DC block.

Performance of couplers 800, 900 is similar to that of coupler 400 described herein. Similar variations and extensions can be applied to couplers 800, 900 as for other couplers described herein.

First Example System

Figure 10:
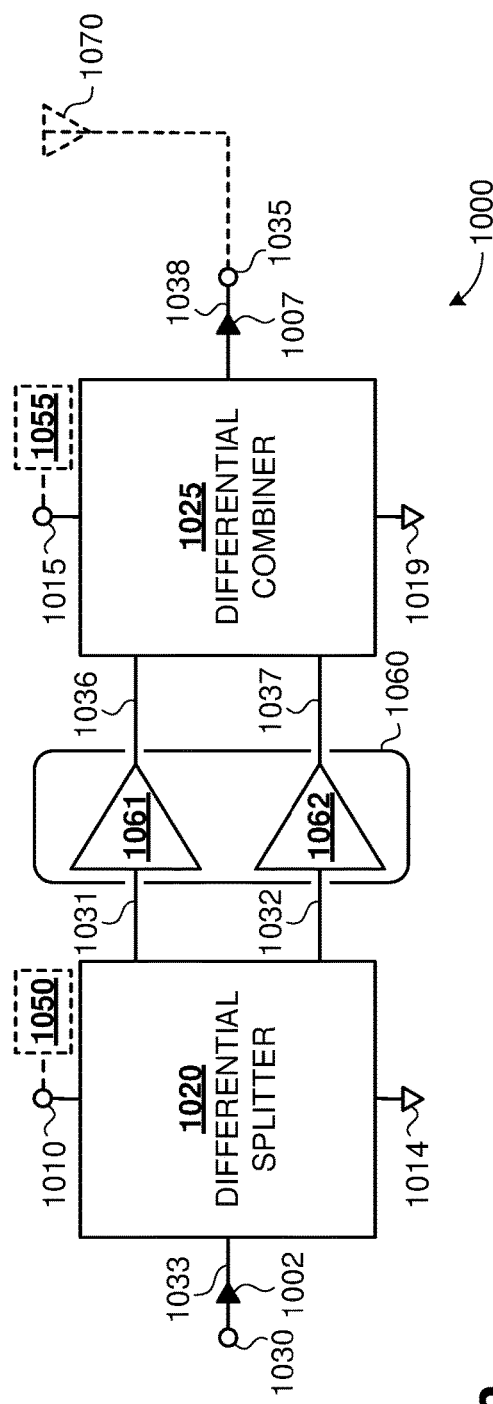
FIG. 10 is a diagram of a first example system which can be implemented using the disclosed technologies.

FIG. 10 is a diagram of a first example amplifier system 1000. Amplifier system 1000 can include a pair of couplers 1020, 1025 and a pair of amplifiers 1061, 1062. Amplifiers 1061, 1062 can be configured to operate as differential amplifier 1060, receiving out-of-phase signal inputs 1031, 1032 from coupler 1020 and transmitting out-of-phase signal outputs 1036, 1037 to coupler 1025. One or both of couplers 1020, 1025 can be implemented as an innovative coupler described herein. Arrows 1002, 1007 indicate a direction of signal power flow through system 1000. Optional components that can be included in some embodiments of system 1000 are shown in dashed outline.

System 1000 can have an input port 1030 and an output port 1035. Input signal 1033 received at port 1030 can be provided to a coupler 1020 configured as a differential splitter to produce out-of-phase signals 1031, 1032 which can be outputted from splitter 1020 and inputted to differential amplifier 1060. In examples, splitter 1020 can be an innovative coupler as disclosed herein. With reference to disclosed couplers, input signal 1033 can be received at port P3 of an innovative coupler, and differential outputs can be provided from ports P1, P2. Optionally, terminal 1010 of coupler 1020 can be coupled to a bias power supply 1050, and terminal 1014 can be tied to circuit ground. Bias power supply 1050 can provide DC power to differential amplifier 1060.

Output signals 1036, 1037 can be inputted to a coupler 1025 configured as a differential combiner to produce combined signal 1038. In examples, combiner 1025 can be an innovative coupler as disclosed herein. With reference to disclosed couplers, signals 1036, 1037 can be received at ports P1, P2 of an innovative coupler, and combined output 1038 can be provided from port P3. Optionally, terminal 1015 of coupler 1025 can be coupled to a bias power supply 1055, and terminal 1019 can be tied to circuit ground. Bias power supply 1055 can provide DC power to differential amplifier 1060.

In some examples, terminals 1010, 1015 can be used to provide bias power to input and output stages of amplifier 1060 while, in other examples, just one of terminals 1010, 1015 is sufficient to power amplifier 1060. In further examples, terminals 1010, 1015 can be used to provide split voltage rails for amplifier 1060, which can have same or opposite polarity.

In some examples, amplifier 1060 or amplifier system 1000 can be a power amplifier. System 1000 can be integrated into a cell phone or other communication terminal, and port 1035 can be coupled to an antenna 1070.

Second Example System

Figure 11:
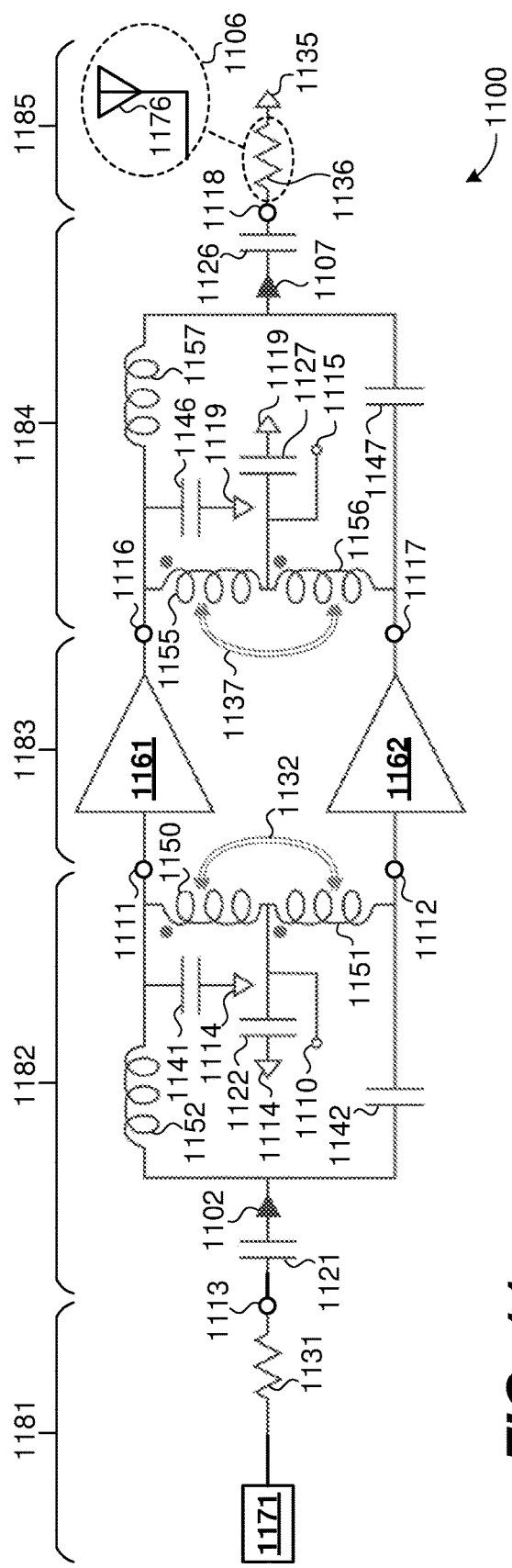
FIG. 11 is a diagram of a second example system according to the disclosed technologies.

FIG. 11 is a composite diagram 1100 of a second example system, including variations and optional features. A few system configurations are described with reference to FIG. 11. Some of these configurations can be incorporated into a cell phone or other communication terminal. Arrows 1102, 1107 indicate a direction of signal power flow through the illustrated system.

In a first configuration, an example system can include amplifiers 1161, 1162 forming a differential amplifier 1183, antenna 1176, a combiner 1184, a bias power supply (similar to 1055, not shown in FIG. 11) directly coupled to terminal 1115 of combiner 1184, and a circuit ground represented by grounding nodes 1119.

Combiner 1184 can include three ports, three inductors, and three capacitors. Ports 1116, 1117 can be similar to ports P1, P2 of other couplers disclosed herein, and can be coupled to receive out-of-phase signals from amplifier 1183. Port 1118 can be coupled to load 1136, which can be an antenna 1176 as indicated by inset 1106. Inductors 1155, 1156 can be similar to inductors L0, L1 of other couplers disclosed herein, and can be respectively coupled between ports 1116, 1117 and bias terminal 1115. As illustrated, inductors 1155, 1156 can have a mutual magnetic coupling factor 1137 which, in examples, can typically be at least 0.2. Inductor 1157 can be coupled between port 1116 and port 1118. Turning to the capacitors, capacitor 1146 can be coupled between port 1116 and circuit ground 1119, and capacitor 1147 can be coupled between port 1117 and port 1118. Terminal 1115 can be a virtual ground, coupled to circuit ground 1119 through bypass capacitor 1127. As illustrated, optional fourth capacitor 1126 can be included adjacent to port 1118 as a DC block. Capacitor 1126 can be omitted in other examples. In variations, the example system can drive a load 1185 other than antenna 1176, as indicated by resistance 1136 coupled between port 1118 and grounding node 1135.

In a second configuration, the example system can include splitter 1182 and signal source 1181. Splitter 1182 can include three ports, three inductors, and two or more capacitors. Ports 1111, 1112 can be similar to ports P1, P2 of other disclosed couplers, and can be coupled to transmit out-of-phase signals to amplifier 1183. Port 1113 can be coupled to receive an input signal from signal source 1181.

Inductors 1150, 1151 can be similar to inductors L0, L1 of other couplers disclosed herein, and can be respectively coupled between ports 1111, 1112 and grounding node 1110. As illustrated, inductors 1150, 1151 can have a mutual magnetic coupling factor 1132 which, in examples, can typically be at least 0.2. Inductor 1152 can be coupled between port 1111 and port 1113. Turning to the capacitors, capacitor 1141 can be coupled between port 1111 and circuit ground 1114, and capacitor 1142 can be coupled between port 1112 and port 1113.

Grounding node 1110 can variously be a virtual ground, e.g. bypassed to ground through optional capacitor 1122 as shown, or tied to circuit ground 1114 with capacitor 1122 omitted. In the former case, optional fourth capacitor 1121 can be included adjacent to port 1113 as a DC block. Blocking capacitor 1122 can be omitted in cases where grounding node 1110 is tied to circuit ground 1114.

Signal source 1181 is shown as an ideal source 1171 in combination with series resistance 1131.

In a further variation, the system can include a second bias power supply directly coupled to terminal 1110.

Example Unbalanced Splitter

FIG. 12A is a table 1201 of specifications for an unbalanced splitter which can be implemented according to the disclosed technologies. These specifications are generally similar to those of FIG. 1, except that the power ratio between ports P1, P2 is 3 dB. That is, the power to be delivered at port P1 is about double the power to be delivered at port P1. The disclosed technologies can also be applied to unbalanced couplers with P1<P2.

FIG. 12B is a table 1202 of example component values for the circuit diagram of FIG. 4 designed based on the specifications of FIG. 12A, with mutual magnetic coupling factor between L0 and L1 selected as K=0.7. Calculation of these component values is described below.

FIGS. 12C-12F are charts 1203-1206 illustrating performance of the example coupler of FIG. 4 and FIG. 12B. Beginning with FIG. 12C, the power split performance of this splitter is excellent. Graphs 1232, 1234 show the power output at ports P1, P2 respectively and can be seen to droop about 0.1 dB across the operating frequency band. Graph 1236 shows the power imbalance between these power outputs (in dB) and is flat to better than 0.05 dB across the entire 16% frequency band.

Turning to FIG. 12D, graphs 1242, 1244 show the output phase at ports P1, P2 respectively, which are seen to vary by about 10° across the frequency band. Graph 1246 shows the difference between the output phases at P1, P2. The phase difference varies by less than 2° across the entire band.

In FIG. 12E, graphs 1252, 1254 show the real and imaginary parts of input impedance at port P3. While the imaginary part of the impedance (reactance) varies by about 20Ω, the dominant real part varies by only about 2Ω across the entire band.

Continuing with FIG. 12F, graph 1262 shows the RF voltage at node 1210, in a variation having virtual ground at node 1210 with a bypass capacitor to ground. Despite the 3 dB power imbalance between the inputs, with α=1.8, the voltage at node 1210 is substantially reduced relative to the input RF voltage. At the center of the band, with the given quality factors associated with the elements, this voltage ratio is approximately 0.0024. At the lower band edge, the highest value of the voltage ratio it is approximately 0.018. Assuming a constant impedance reference, these values represent an RF isolation at the node of approximately 52 dB at the band center and 35 dB at the lower band edge.

Example Method

Figure 13:
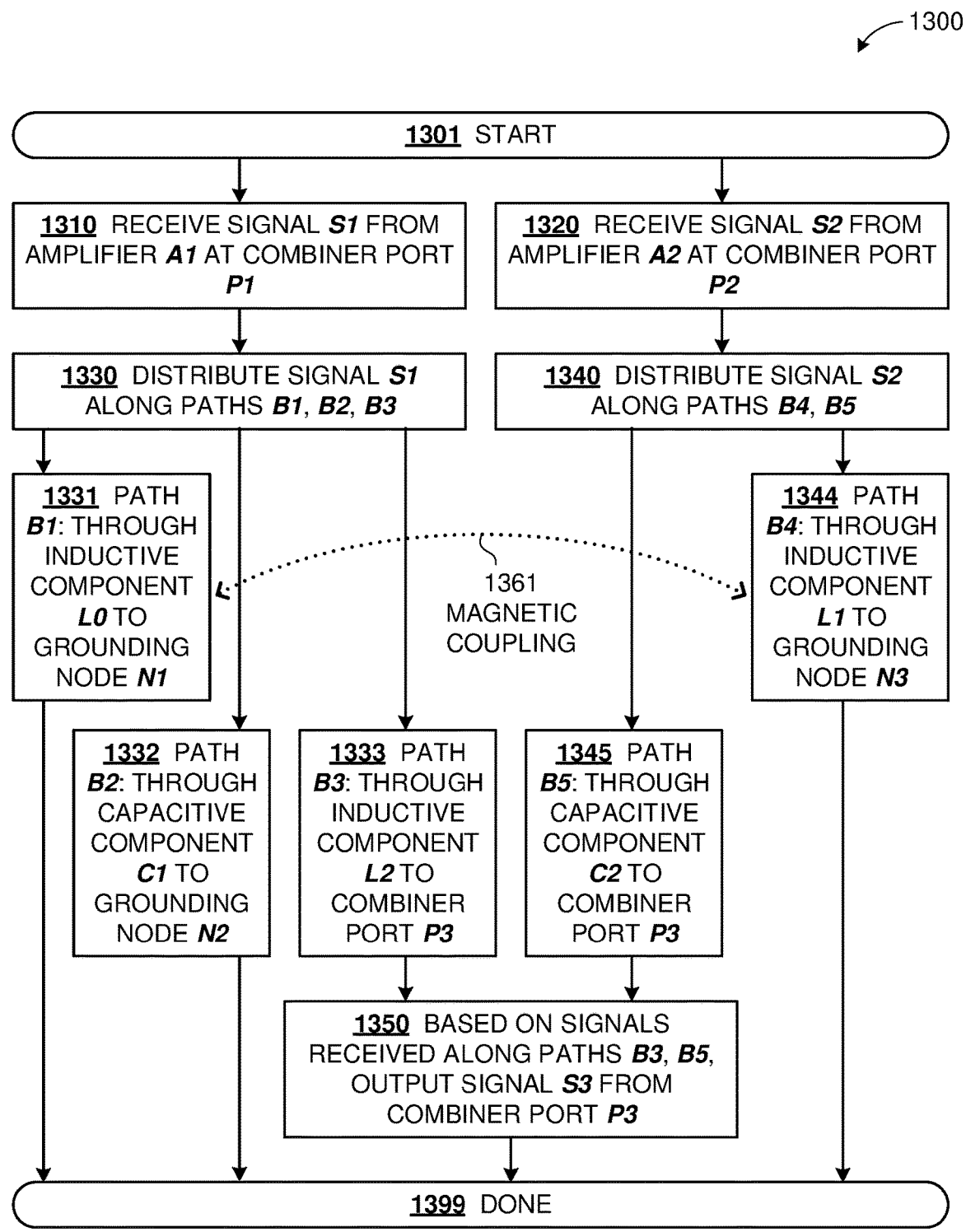
FIG. 13 is a flowchart of an example method according to the disclosed technologies.

FIG. 13 is a flowchart 1300 of an example method. This method follows a signal propagating through paths of an innovative combiner. The combiner can be similar to couplers 400, 800, 900 described herein, and its ports P1-P3 can be similar to corresponding ports P1-P3 described for such other couplers. The instant method is described in context of FIG. 4 for convenience of illustration, however the method is not so limited and can be implemented with other coupler circuits as well.

The method commences at start block 1301. At process block 1310, a signal S1 can be received from a first upstream device, such as amplifier A1, at port P1 of an instant combiner. At block 1320, a signal S2 can be received from a second upstream device, such as amplifier A2, at port P2 of the instant combiner. The signals can be RF signals or other oscillatory signals. Amplifiers A1, A2 can be a differential amplifier pair. The amplifiers and combiner can be part of a communication transmitter, such as a cell phone. In such applications, signals S1, S2 can be received simultaneously, but this is not a requirement and, in other applications a combiner can perform the instant method as a multiplexer, with only one of signals S1, S2 active at any given time.

At block 1330, the signal S1 can be distributed from port P1 along three paths labeled B1, B2, B3. That is, if W1 is the net input power of signal S1 at port P1 (which can be less than the incident power because of reflection), respective net signal powers W11, W12, W13 can be propagated along paths B1, B2, B3, such that W11+W12+W13=W1. At block 1331, a portion of signal S1 can flow in path B1 through a first inductive component to a first grounding node. The first inductive component can be similar to inductor L0 430 of FIG. 4, and the first grounding node can be similar to node 410. At block 1332, another portion of signal S1 can flow in path B2 through a first capacitive component to a second grounding node. The first capacitive component and second grounding node can be similar to capacitor C1 441 and node 414 of FIG. 4. At block 1333, a third portion of signal S1 can flow in path B3 through a second inductive component to combiner port P3. The second inductive component can be similar to inductor L2 432 of FIG. 4. In examples, distribution at block 1330 can occur instantaneously and continuously over the duration of signal S1 and, correspondingly, process blocks 1331-1333 can occur simultaneously.

Correspondingly, at block 1340, the signal S2 can be distributed from port P2 along two paths labeled B4, B5. That is, if W2 is the net input power of signal S2 at port P2 (which can be less than the incident power because of reflection), respective net signal powers W24, W25 can be propagated along paths B4, B5 such that W24+W25=W2. At block 1344, a portion of signal S2 can flow in path B4 through a third inductive component to a third grounding node. The third inductive component can be similar to inductor L1 431 of FIG. 4, and the first grounding node can be similar to node 410. Like coupler 400 of FIG. 4, the first and third inductive components can have a mutual magnetic coupling factor 1361, shown by dotted line in FIG. 13. At block 1345, another portion of signal S2 can flow in path B5 through a second capacitive component to combiner port P3. The second capacitive component can be similar to capacitor C2 442 of FIG. 4. In examples, distribution at block 1340 can occur instantaneously and continuously over the duration of signal S2 and, correspondingly, process blocks 1344-1345 can occur simultaneously.

At block 1350, a portion of signal S1 can be received at combiner port P3 via path B3 and block 1333, and a portion of signal S2 can be received at combiner port P3 via path B5 and block 1345. These signal portions can be combined to deliver a third signal S3 from combiner port P3. In examples, signal S3 can be outputted toward an antenna for transmission. In some examples, signals S1, S2 can be present simultaneously and the respective portions can be summed at block 1350. In other examples, signals S1, S2 can be present at distinct times and the respective portions can be multiplexed at block 1350.

While some variations and extensions of the disclosed method have been described above, numerous additional variations and extensions can be implemented within scope of the disclosed technologies. In some examples, the first or third grounding node can be a virtual ground, and a bias voltage (e.g. for amplifier A1 or A2) can be applied at the respective grounding node. The first and third grounding nodes can be a common node, and a common bias voltage can be applied out ports P1, P2 at the common node.

Signal S1 can operate over at least two carrier frequencies F1<F2, or can operate wideband over a frequency interval [F1, F2]. The bandwidth F2–F1 can be at least 5%, at least 10%, or at least 20% of the mean frequency (F1+F2)/2. In varying examples, multiple carriers can be superposed at a single time slot, or can be switched or multiplexed at different periods of time. To illustrate, a cell phone can roam from one network, supporting carrier frequency F1, to another network supporting carrier frequency F2, causing the cell phone to hop from frequency F1 to frequency F2. As another illustration, the cell phone can implement frequency hopping spread spectrum over successive time slots, with carrier frequency following a predetermined pattern.

In a common differential amplifier configuration, the power ratio between signals S1, S2 can be 1:1 (0 dB) and the phase offset can be 180°, and signals can operate at a same carrier frequency, with a same modulation, and same information content. However these are not requirements, and the method can also be applied with signals S1, S2 having different power ratios (e.g. 3 dB), different phase relationships (e.g. 90°), different carrier frequencies, different modulation, different information content, or different active time intervals, in any combination.

In examples where signals S1, S2 have a predetermined first ratio, the first and third inductive components can be set to a second ratio determined based on the first ratio and on mutual magnetic coupling factor 1361.

Example Design

In this section, design calculations for FIG. 4 can be performed for the specifications of FIG. 1 and FIG. 12A. These calculations are based on solving circuit equations using principles known in the art.

1. Design Inputs: Z1, Z2, Z3, ρ, F0, K

Initially, design inputs are provided as shown in FIG. 1 and FIG. 12A. The output power ratio and phase shift are used to determine the voltage ratio ρ=V1/V2, where V1, V2 are the voltages at ports P1, P2 respectively. In general p can be complex, however for the present cases of interest, the voltages V1, V2 are specified 1800 offset in phase, and p is negative real. ρ is −1 for the balanced design of FIG. 1 and −1.41 for the 2:1 power split of FIG. 12A.

Another design input is the magnetic coupling factor K. In some applications, better performance over bandwidth can be obtained with higher values of K. In other applications, particularly with narrow bandwidths, K has less impact on design and lower values of K can be utilized, even down to zero. Lower values of K can advantageously offer flexibility in layout and manufacturing. K can be selected as 0.7 for the present designs.

2. Intermediate Variables: α, G31, G32, Δϕ, B2

The inductor ratio α=L0/L1 can be calculated from Equation (1):

$$\alpha = \left[\frac{(1+\rho) \cdot k - \sqrt{(1+\rho)^2 \cdot k^2 - 4 \cdot \rho}}{2}\right]^2. \quad (1)$$

α evaluates to 1.0 and 1.8 for FIG. 1 and FIG. 12A respectively.

Partial conductances G31, G32 looking into port P3 towards ports P1, P2, respectively, can be calculated from Equations (2)-(3):

$$G31 = \frac{\rho^2 \cdot Z2}{Z3 \cdot (Z1 + \rho^2 \cdot Z2)}; \quad (2)$$

$$G32 = \frac{Z1}{Z3 \cdot (Z1 + \rho^2 \cdot Z2)}. \quad (3)$$

For FIG. 1, G31=G32=0.0100 mho and for FIG. 12A, G31=0.01333 mho and G32=0.0067 mho.

Internal phase shift Δϕ can be calculated from Equation (4):

$$\Delta\phi = \cos^{-1}\left(\frac{\sqrt{G31/Z1} - \sqrt{G32/Z2}}{G31 + G32}\right). \quad (4)$$

Accordingly, Δϕ=−90° and −57.67° for FIG. 1 and FIG. 12A respectively.

Shunt susceptance factor B2 can be evaluated from Equation (5):

$$B2 = \frac{\cos(\Delta\phi) + \sqrt{G32 \cdot Z2}}{Z2 \cdot \sin(\Delta\phi)}. \quad (5)$$

B2 evaluates to −0.316 and −0.938 for FIG. 1 and FIG. 12A respectively.

3. Component Values: L2, L1, L0, C2, C1

Using the intermediate values, the inductance values L2, L1, L0 and capacitance values C2, C1 can each be calculated, as indicated in Equations (6)-(10):

$$L1 = \frac{1}{(2\pi \cdot F0) \cdot (1 + K \cdot \sqrt{\alpha}) \cdot (-B2)}; \quad (6)$$

$$L2 = -\sqrt{\frac{Z1}{G31}} \cdot \frac{\sin(\Delta\phi)}{(2\pi \cdot F0)}; \quad (7)$$

$$L0 = \alpha \cdot L1; \quad (8)$$

$$C2 = -\sqrt{\frac{G32}{Z2}} \cdot \frac{\sin(\Delta\phi)}{(2\pi \cdot F0)}; \quad (9)$$

$$C1 = \left(\frac{\cos(\Delta\phi) - \sqrt{G31 \cdot Z1}}{Z1 \cdot \sin(\Delta\phi)}\right) - B2 \cdot \left(\frac{1 + K \cdot \sqrt{\alpha}}{\alpha + K \cdot \sqrt{\alpha}}\right). \quad (10)$$

These component values evaluate to those shown in FIG. 5 and FIG. 12B respectively, which completes the design calculation. In varying examples, these calculations can be extended to incorporate bypass or blocking capacitors, phase offsets other than 180°, or complex input impedances, according to well-known principles of circuit analysis and simultaneous equations.

Additional Examples

The following are additional examples of the disclosed technologies.

Example 1 is a coupler (e.g. 400) having first, second, and third ports (e.g. 411-413), including: a first inductor (e.g. 430) coupled between the first port (e.g. 411) and a first grounding node (e.g. 410: hard or virtual); a second inductor (e.g. 431) coupled between the second port (e.g. 412) and a second grounding node (e.g. also 410), wherein the first inductor (e.g. 430) and the second inductor (e.g. 431) have a predetermined mutual magnetic coupling factor (e.g. 435); a third inductor (e.g. 432) coupled between the first port (e.g. 411) and the third port (e.g. 413); a first capacitor (e.g. 441) coupled between the first port (e.g. 411) and a third grounding node (e.g. 414); and a second capacitor (e.g. 442) coupled between the second port (e.g. 412) and the third port (e.g. 413).

Example 2 includes the subject matter of Example 1, and further specifies that the first and second inductors have equal values of inductance to within a 20% tolerance.

Example 3 includes the subject matter of any of Examples 1-2, and further specifies that the first grounding node is circuit ground, the second grounding node is circuit ground, the third grounding node is circuit ground, and the predetermined mutual magnetic coupling factor is less than 0.1.

Example 4 includes the subject matter of any of Examples 1-2, and further specifies that the predetermined mutual magnetic coupling factor is at least 0.2.

Example 5 includes the subject matter of any of Examples 1-4, and further includes one or more third capacitors (e.g. 1122, 1127) coupled between the first grounding node and circuit ground and between the second grounding node and circuit ground.

Example 6 includes the subject matter of any of Examples 1-5, and further specifies that the coupler provides a DC block between the second port and circuit ground.

Example 7 includes the subject matter of any of Examples 1-2 or 4-6, and further specifies that the predetermined mutual magnetic coupling factor is at least 0.6.

Example 8 includes the subject matter of any of Examples 1-7, and further specifies that a coupling imbalance between the first and second ports varies by less than 0.5 dB over a 10% bandwidth.

Example 9 includes the subject matter of any of Examples 1-8, and further specifies that: the coupler is configured to receive out-of-phase first and second input signals at the first and second ports respectively, and to generate a combined output signal at the third port; and the input impedance at each of the first and second ports varies by less than 15% over a 10% bandwidth.

Example 10 includes the subject matter of Example 9, and further specifies that: the coupler is configured to receive an input signal at the third port and to generate out-of-phase first and second output signals at the first and second ports respectively; and a phase difference between the first and second output signals varies by less than 5° over a 10% bandwidth.

Example 11 is a system, including: a differential amplifier having first and second out-of-phase signal outputs; the coupler of any of Examples 1-10; and an antenna coupled to the third port of the coupler; wherein the first and second ports of the coupler are respectively coupled to the first and second out-of-phase signal outputs.

Example 12 is an amplifier assembly, including: a differential amplifier having first and second out-of-phase signal inputs; and the coupler of any one of Examples 1-10; wherein the first and second ports of the coupler are respectively coupled to the first and second out-of-phase signal inputs of the differential amplifier.

Example 13 includes the subject matter of any of Examples 1-12, and further specifies that the first and second inductors comprise respective first and second planar spiral patterns formed on a substrate.

Example 14 includes the subject matter of Example 13, and further specifies that the first and second spiral patterns are formed on separate layers and have at least 20% area overlap.

Example 15 includes the subject matter of Example 13, and further specifies that the first and second spiral patterns are formed in a common layer.

Example 16 is a four-to-one coupler, including: first, second, and third couplers according to any of Examples 1-10 or 13-15; wherein the third ports of the first and second couplers are respectively coupled to the first and second ports of the third coupler.

Example 17 includes the subject matter of any of Examples 1-16, and further specifies that the first grounding node and the second grounding node are directly tied to circuit ground.

Example 18 is a method, including: receiving (e.g. 1310) a first signal outputted from a first RF amplifier (e.g. 1161) at a first port (e.g. 1116) of a combiner (e.g. 1184); receiving (e.g. 1320) a second signal outputted by a second RF amplifier (e.g. 1162) at a second port (e.g. 1117) of the combiner (e.g. 1184), wherein the first and second output signals are out-of-phase; distributing (e.g. 1330) the first signal from the first port along first, second, and third paths, wherein: the first path (e.g. 1331) passes through a first inductive component (e.g. 1155) to a first grounding node (e.g. 1115); the second path (e.g. 1332) passes through a first capacitive component (e.g. 1146) to a second grounding node (e.g. 1119); and the third path (e.g. 1333) passes through a second inductive component (e.g. 1157) to a third port (e.g. 1118) of the combiner (e.g. 1184); distributing (e.g. 1340) the second signal from the second port along fourth and fifth paths, wherein: the fourth path (e.g. 1344) passes through a third inductive component (e.g. 1156) to a third grounding node (e.g. also 1115), wherein the first and third inductive components (e.g. 1155, 1156) have a mutual magnetic coupling factor (e.g. 1137) of at least Example 0.2; and the fifth path (e.g. 1345) passes through a second capacitive component (e.g. 1147) to the third port (e.g. 1118) of the combiner (e.g. 1184); at the third port (e.g. 1118), responsive to receiving a portion of the first signal along the third path and receiving a portion of the second signal along the fifth path, outputting (e.g. 1350) a third signal from the combiner (e.g. 1184).

Example 19 includes the subject matter of Example 18, and further specifies that the third signal is outputted toward an antenna (e.g. 1176).

Example 20 includes the subject matter of any of Examples 18-19, comprising: applying a bias voltage for the first RF amplifier at the first grounding node.

Example 21 includes the subject matter of any of Examples 18-20, and further specifies that: magnitudes of the first and second signals have a first predetermined ratio; inductance values of the first and third inductive components have a second predetermined ratio; and the second predetermined ratio is selected based on the first predetermined ratio and on the mutual magnetic coupling factor.

Example 22 includes the subject matter of any of Examples 18-21, and further specifies that the first signal has first and second carrier frequencies, and a difference between the first and second frequencies is at least 10% of a mean of the first and second frequencies.

Example 23 is a system, including: a differential amplifier (e.g. 1183) having first and second out-of-phase signal outputs; and an antenna (e.g. 1176); a bias power supply (e.g. 1055); a circuit ground (e.g. 1119); and a combiner (e.g. 1184) comprising: first and second ports (e.g. 1116, 1117) respectively coupled to the first and second out-of-phase signal outputs of the differential amplifier (e.g. 1183); a third port (e.g. 1811 coupled to the antenna; a terminal coupled to the bias power supply; a first inductor (e.g. 1155) coupled between the first port (e.g. 1116) and the terminal (e.g. 1115); a second inductor (e.g. 1156) coupled between the second port (e.g. 1117) and the terminal (e.g. 1115), wherein the first inductor (e.g. 1155) and the second inductor (e.g. 1156) have a mutual magnetic coupling factor (e.g. 1137) of at least Example 0.2; a third inductor (e.g. 1157) coupled between the first port (e.g. 1116) and the third port (e.g. 1118); a first capacitor (e.g. 1146) coupled between the first port (e.g. 1116) and the circuit ground (e.g. 1119); a second capacitor (e.g. 1147) coupled between the second port (e.g. 1117) and the third port (e.g. 1118); and a third capacitor (e.g. 1127) coupled between the terminal (e.g. 1115) and the circuit ground (e.g. 1119).

Example 24 includes the subject matter of Example 23, and further specifies that the system is a cell phone.

Example 25 includes the subject matter of any of Examples 23-24, and further specifies that the differential amplifier has first and second out-of-phase signal inputs, and further includes: a signal source (e.g. 1181); and a splitter (e.g. 1182) comprising: fifth and sixth ports (e.g. 1111, 1112) respectively coupled to the first and second signal out-of-phase inputs of the differential amplifier (e.g. 1183); a seventh port (e.g. 1113) coupled to receive an input signal from the signal source (e.g. 1181); a fourth inductor (e.g. 1150) coupled between the fifth port (e.g. 1111) and a grounding node (e.g. 1110); a fifth inductor (e.g. 1151) coupled between the sixth port (e.g. 1112) and the grounding node (e.g. 1112), wherein the fourth inductor (e.g. 1150) and the fifth inductor (e.g. 1151) have a mutual magnetic coupling factor (e.g. 1132) of at least Example 0.2; a sixth inductor (e.g. 1152) coupled between the fifth port (e.g. 1111) and the seventh port (e.g. 1113); a fourth capacitor (e.g. 1141) coupled between the fifth port (e.g. 1111) and the circuit ground (e.g. 1114); and a fifth capacitor (e.g. 1142) coupled between the sixth port (e.g. 1112) and the seventh port (e.g. 1113).

Example 26 includes the subject matter of Example 25, and further specifies that the bias power supply is a first bias power supply, and further includes: a sixth capacitor coupled between the grounding node and the circuit ground; and a direct coupling between the grounding node and a second bias power supply.

GENERAL CONSIDERATIONS

As used in this application, the singular forms "a," "an," and "the" include the plural forms unless the context clearly dictates otherwise. Additionally, the terms "includes" and "incorporates" mean "comprises." Further, the term "coupled" encompasses mechanical, electrical, magnetic, optical, as well as other practical ways of coupling or linking items together, and does not exclude the presence of intermediate elements between the coupled items. Furthermore, as used herein, the terms "or" and "and/or" mean any one item or combination of items in the phrase, and do not imply that the joined terms are mutually exclusive.

The systems, methods, and apparatus described herein should not be construed as limiting in any way. Instead, this disclosure is directed toward all novel and nonobvious features and aspects of the various disclosed embodiments, alone and in various combinations and subcombinations with one another. The disclosed systems, methods, and apparatus are not limited to any specific aspect or feature or combinations thereof, nor do the disclosed things and methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed things and methods can be used in conjunction with other things and methods. Additionally, the description sometimes uses terms like "amplify," "couple," "distribute," "form," "generate," "output," "provide," "receive," "transmit," and "use," as high-level descriptions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Some examples can be implemented with the aid of electronic design automation (EDA) tools. Certain details of suitable hardware, such as electrical, electronic, or RF circuitry, are well known and need not be set forth in detail in this disclosure.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved. The technologies from any example can be combined with the technologies described in any one or more of the other examples.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope of these claims and their equivalents.

I claim:

1. A coupler having first, second, and third ports, and comprising:
   a first inductor coupled between the first port and a first grounding node;
   a second inductor coupled between the second port and a second grounding node, wherein the first inductor and the second inductor have a predetermined mutual magnetic coupling factor;
   a third inductor coupled between the first port and the third port;
   a first capacitor coupled between the first port and a third grounding node;
   a second capacitor coupled between the second port and the third port; and
   one or more third capacitors coupled between the first grounding node and circuit ground and between the second grounding node and circuit ground.

2. The coupler of claim 1, wherein the first and second inductors have equal values of inductance to within a 20% tolerance.

3. The coupler of claim 1, wherein the predetermined mutual magnetic coupling factor is less than 0.1.

4. The coupler of claim 1, wherein the predetermined mutual magnetic coupling factor is at least 0.2.

5. An amplifier assembly comprising:
   a differential amplifier having first and second out-of-phase signal inputs; and
   the coupler of claim 1;
   wherein the first and second ports of the coupler are respectively coupled to the first and second out-of-phase signal inputs of the differential amplifier.

6. The coupler of claim 1, wherein the coupler provides a DC block between the second port and circuit ground.

7. The coupler of claim 1, wherein the predetermined mutual magnetic coupling factor is at least 0.6.

8. The coupler of claim 1, wherein the first and second inductors comprise respective first and second planar spiral patterns formed on a substrate.

9. The coupler of claim 1, wherein a coupling imbalance between the first and second ports varies by less than 0.5 dB over a 10% bandwidth.

10. A system comprising:
    a differential amplifier having first and second out-of-phase signal outputs;
    the coupler of claim 1; and
    an antenna coupled to the third port of the coupler;
    wherein the first and second ports of the coupler are respectively coupled to the first and second out-of-phase signal outputs.

11. The coupler of claim 1, wherein:
    the coupler is a three-port combiner configured to:
      receive differential input signals at the first and second ports;
      provide a single-ended output signal at the third port;
      propagate a first bias voltage applied at the first grounding node to the first port; and
      propagate a second bias voltage applied at the second grounding node to the second port; and
    resistive losses of the coupler are due to non-ideal components.

12. The coupler of claim 11, wherein:
    the differential input signals are balanced;
    the second grounding node is the first grounding node;
    the second bias voltage is the first bias voltage; and
    the first and second inductors have equal values of inductance to within a 20% tolerance.

13. A coupler having first, second, and third ports, and comprising:
    a first inductor coupled between the first port and a first grounding node;
    a second inductor coupled between the second port and a second grounding node, wherein the first inductor and the second inductor have a predetermined mutual magnetic coupling factor;
    a third inductor coupled between the first port and the third port;
    a first capacitor coupled between the first port and a third grounding node; and
    a second capacitor coupled between the second port and the third port;
    wherein the coupler is configured to receive out-of-phase first and second input signals at the first and second ports respectively, and to generate a combined output signal at the third port; and
    wherein the input impedance at each of the first and second ports varies by less than 15% over a 10% bandwidth.

14. The coupler of claim 13, wherein:
    the coupler is configured to receive an input signal at the third port and to generate out-of-phase first and second output signals at the first and second ports respectively; and
    a phase difference between the first and second output signals varies by less than 5° over a 10% bandwidth.

15. The coupler of claim 13, wherein:
    the out-of-phase first and second input signals are differential input signals;
    the coupler is a three-port combiner; and
    resistive losses of the coupler are due to non-ideal components.

16. The coupler of claim 15, wherein:
    the differential input signals are balanced;
    the second grounding node is the first grounding node;
    the coupler further comprises one or more third capacitors coupled between the first grounding node and circuit ground;
    the coupler is configured to propagate a bias voltage applied at the first grounding node to the first port and to the second port; and
    the first and second inductors have equal values of inductance to within a 20% tolerance.

17. A system comprising:
    a differential amplifier having first and second out-of-phase signal outputs; and
    an antenna;
    a bias power supply;
    a circuit ground; and
    a combiner comprising:
      first and second ports respectively coupled to the first and second out-of-phase signal outputs of the differential amplifier;
      a third port coupled to the antenna;
      a terminal coupled to the bias power supply;
      a first inductor coupled between the first port and the terminal;
      a second inductor coupled between the second port and the terminal, wherein the first inductor and the second inductor have a mutual magnetic coupling factor of at least 0.2;
      a third inductor coupled between the first port and the third port;
      a first capacitor coupled between the first port and the circuit ground;

a second capacitor coupled between the second port and the third port; and a third capacitor coupled between the terminal and the circuit ground.

18. The system of claim 17, wherein the differential amplifier has first and second out-of-phase signal inputs, and further comprising:

a signal source; and a splitter comprising:

fifth and sixth ports respectively coupled to the first and second signal out-of-phase inputs of the differential amplifier;

a seventh port coupled to receive an input signal from the signal source;

a fourth inductor coupled between the fifth port and a grounding node;

a fifth inductor coupled between the sixth port and the grounding node, wherein the fourth inductor and the fifth inductor have a mutual magnetic coupling factor of at least 0.2;

a sixth inductor coupled between the fifth port and the seventh port;

a fourth capacitor coupled between the fifth port and the circuit ground; and a fifth capacitor coupled between the sixth port and the seventh port.

19. The system of claim 17, wherein the system is a cell phone.

20. A method comprising:

receiving a first signal outputted from a first RF amplifier at a first port of a combiner;

receiving a second signal outputted by a second RF amplifier at a second port of the combiner, wherein the first and second output signals are out-of-phase;

distributing the first signal from the first port along first, second, and third paths, wherein:

the first path passes through a first inductive component to a first grounding node;

the second path passes through a first capacitive component to a second grounding node; and the third path passes through a second inductive component to a third port of the combiner;

distributing the second signal from the second port along fourth and fifth paths, wherein:

the fourth path passes through a third inductive component to a third grounding node, wherein the first and third inductive components have a mutual magnetic coupling factor of at least 0.2; and the fifth path passes through a second capacitive component to the third port of the combiner; and at the third port, responsive to receiving a portion of the first signal along the third path and receiving a portion of the second signal along the fifth path, outputting a third signal from the combiner.

21. The method of claim 20, wherein the third signal is outputted toward an antenna.

22. The method of claim 20, further comprising:

applying a bias voltage for the first RF amplifier at the first grounding node.

23. The method of claim 20, wherein:

magnitudes of the first and second signals have a first predetermined ratio;

inductance values of the first and third inductive components have a second predetermined ratio; and the second predetermined ratio is selected based on the first predetermined ratio and on the mutual magnetic coupling factor.

* * * * *